(12) United States Patent
Mori et al.

(10) Patent No.: US 7,161,291 B2
(45) Date of Patent: Jan. 9, 2007

(54) DISPLAY ELEMENT AND METHOD FOR PRODUCING THE SAME

(75) Inventors: Toshitaka Mori, Tokyo-To (JP); Yasuyuki Oyagi, Tokyo-To (JP); Junji Kido, 3-12-16, Rinsenji, Yonezawa-Shi, Yamagata-Ken (JP)

(73) Assignees: Dai Nippon Printing Co., Ltd, Tokyo-to (JP); Junji Kido, Yamagata-Ken (JP)

( * ) Notice: Subject to any disclaimer, the term of this patent is extended or adjusted under 35 U.S.C. 154(b) by 22 days.

(21) Appl. No.: 10/668,117

(22) Filed: Sep. 22, 2003

(65) Prior Publication Data

US 2004/0189186 A1    Sep. 30, 2004

(30) Foreign Application Priority Data

Sep. 24, 2002  (JP) .............................. 2002-277837

(51) Int. Cl.
*H01J 1/62* (2006.01)
*H01J 63/04* (2006.01)
*H05B 33/00* (2006.01)

(52) U.S. Cl. ............... 313/503; 313/506; 313/113; 313/495

(58) Field of Classification Search ........ 313/503–506, 313/113, 114; 257/40; 362/800; 315/169.3; 345/36, 45, 76
See application file for complete search history.

(56) References Cited

U.S. PATENT DOCUMENTS

| 4,511,451 | A | * | 4/1985 | Sella et al. ............ 204/298.21 |
|---|---|---|---|---|
| 4,931,692 | A | * | 6/1990 | Takagi et al. ............... 313/503 |
| 5,446,334 | A | * | 8/1995 | Gaffney ...................... 310/338 |
| 6,052,271 | A | * | 4/2000 | Nakamura ................... 361/303 |
| 6,734,636 | B1 | * | 5/2004 | Sanford et al. .......... 315/169.3 |
| 6,774,561 | B1 | * | 8/2004 | Hirano ........................ 313/503 |
| 6,818,325 | B1 | * | 11/2004 | Mishima et al. ............ 428/690 |
| 6,831,408 | B1 | * | 12/2004 | Hirano et al. ............... 313/504 |
| 6,853,130 | B1 | * | 2/2005 | Morii .......................... 313/503 |
| 6,869,635 | B1 | * | 3/2005 | Kobayashi ................... 427/66 |
| 6,885,147 | B1 | * | 4/2005 | Howard et al. ............. 313/504 |
| 2001/0051487 | A1 | * | 12/2001 | Hashimoto et al. ........... 445/24 |
| 2002/0021088 | A1 | * | 2/2002 | Howard et al. .............. 313/504 |
| 2002/0030441 | A1 | * | 3/2002 | Takematsu et al. ......... 313/504 |
| 2002/0057052 | A1 | * | 5/2002 | Kobayashi ................... 313/504 |
| 2002/0115877 | A1 | * | 8/2002 | Ueda et al. .................. 556/418 |
| 2003/0062519 | A1 | * | 4/2003 | Yamazaki et al. ............ 257/40 |
| 2004/0046496 | A1 | * | 3/2004 | Mishima ..................... 313/504 |

FOREIGN PATENT DOCUMENTS

| JP | 2001-043980 |  | 2/2001 |
|---|---|---|---|
| JP | 2002-216976 |  | 8/2002 |
| WO | WO02056641 | A1 * | 7/2002 |

* cited by examiner

*Primary Examiner*—Ashok Patel
(74) *Attorney, Agent, or Firm*—Harness, Dickey, & Pierce, P.L.C.

(57) ABSTRACT

Disclosed are a production process of a display device, which can prevent the oxidation of a lower electrode and can maintain luminescence efficiency, high contract, and durability, and a display element. The display element comprises a first electrode, a luminescent layer, a second electrode, and a transparent substrate. The first electrode comprises a metal layer and a corrosion-resistant charge injection accelerating layer. The corrosion-resistant charge injection accelerating layer has been formed by subjecting a surface layer in the metal layer to plasma treatment using an oxygen atom-containing gas.

2 Claims, 1 Drawing Sheet

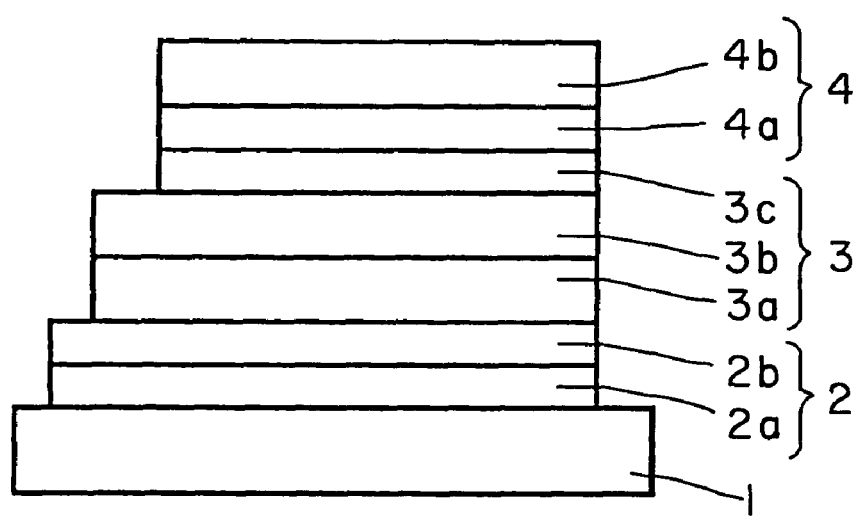
F I G. 1

DISPLAY ELEMENT AND METHOD FOR PRODUCING THE SAME

BACKGROUND OF THE INVENTION

1. Field of the Invention

The present invention relates to a display element, particularly an electroluminescent display element and a process for producing the same.

2. Background Art

An electroluminescent display element, especially an electroluminescent element (hereinafter often referred to as "EL element"), basically comprises a transparent substrate and, stacked on the transparent substrate in the following order, an anode, a luminescent layer, and a cathode and is constructed so that luminescence in the EL element occurs from the anode side (substrate side).

In order to cope with demands for diversification of screen display devices and the like, however, EL elements, which cause luminescence from the cathode side, have been required and developed. For example, Japanese Patent Laid-Open No. 43980/2001 proposes a cathode luminescence-type organic EL element in which an anode in its part in contact with an organic layer side contains a metal belonging to the group 5 or 6 of the periodic table (particularly chromium, molybdenum, tangsten, tantalum, and niobium) which can inhibit the occurrence of dark spots (nonluminous points) and thus can prevent uneven luminescence. Japanese Patent Laid-Open No. 216976/2002 proposes an organic EL element which can make the roughness of the surface of the lower electrode even and can suppress the occurrence of a leak current and dark spots by virtue of the adoption of a lower electrode comprising a metal layer (chromium) and a buffer thin-film layer formed by sputtering an oxide of the metal having a higher electrical conductivity than an organic layer on the metal layer.

At the present time, however, there remains an earnest desire for the development of a display element which has been improved in current density and luminescence efficiency over an indium-tin oxide (ITO) electrode.

SUMMARY OF THE INVENTION

The present inventor has now found that a luminescent element, which has improved current density and luminescent efficiency and can prevent the corrosion of the first electrode, can be realized by adopting, as an electrode corresponding to the above lower electrode, a first electrode comprising a metal layer and a corrosion-resistant charge injection accelerating layer formed by subjecting a surface of the metal layer to plasma treatment. Accordingly, an object of the present invention is to provide this type of luminescent element.

Thus, according to one aspect of the present invention, there is provided a display element comprising a first electrode, a luminescent layer, a second electrode, and a substrate, said first electrode comprising a metal layer and a corrosion-resistant charge injection accelerating layer, said corrosion-resistant charge injection accelerating layer having been formed by subjecting a surface layer in said metal layer to plasma treatment using an oxygen atom-containing gas.

According to another aspect of the present invention, there is provide a process for producing a display element comprising the steps of:

forming a metal layer on a substrate;

performing patterning on the top of the metal layer;

subjecting the surface of the metal layer to plasma treatment using an oxygen atom-containing atom to convert the surface of the metal layer to a corrosion-resistant charge injection accelerating layer;

forming a luminescent layer on the corrosion-resistant charge injection accelerating layer; and forming a second electrode on the luminescent layer.

In the display element according to the present invention, by virtue of the construction such that the first electrode comprises a metal layer and a corrosion-resistant charge injection accelerating layer formed on a surface of the metal layer by subjecting the surface of the metal layer to plasma treatment, the oxidation and corrosion of the first electrode can be prevented to improve the durability of the first electrode and, at the same time, the current density and luminescence efficiency of the display element can be significantly improved.

Further, in the production process of a display element according to the present invention, by virtue of the formation of a corrosion-resistant charge injection accelerating layer on the metal layer by subjecting the surface of the metal layer to plasma treatment, after this treatment, a luminescent layer can be formed without cleaning the substrate. This can simplify the production process and can lower the production cost and, at the same time, can suppress shortcircuiting derived from inclusion of fine particles and the occurrence of nonluminous points.

BRIEF DESCRIPTION OF DRAWING

FIG. 1 is a schematic cross-sectional view showing an embodiment of the EL element according to the present invention.

Reference characters in FIG. 1 will be described.

Description of Reference Characters in the Drawing

1: substrate, 2: first electrode, 2a: metal layer, 2b: corrosion-resistant charge injection accelerating layer, 3: luminescent part, 3a: hole injection transport layer, 3b: luminescent layer, 3c: electron injection layer, 4: second electrode, 4b: protective layer, and 4a: transparent electrode layer.

DETAILED DESCRIPTION OF THE INVENTION

Display Element of Invention

The display element of the present invention and the production process of the same will be described with reference to FIG. 1. FIG. 1 is a schematic cross-sectional view of an embodiment of the display element according to the present invention. The display element shown in FIG. 1 comprises a substrate 1, a first electrode 2, a luminescent part 3 including a luminescent layer 3b, and a second electrode 4. In another embodiment of the present invention, the display element comprises an electron injection layer 3c provided between the second electrode and the luminescent layer 3b. In a further embodiment of the present invention, the second electrode 4 comprises a protective layer 4b and a transparent electrode layer 4a.

In the present invention, a metal layer 2a constituting the first electrode 2 is formed on the substrate 1. Next, a surface (second electrode 4 side) of the metal layer 2a is subjected to plasma treatment using an oxygen atom-containing gas to form a corrosion-resistant charge injection accelerating layer 2b. Next, the luminescent part 3 comprising the luminescent layer 3b and optionally other layer(s) is formed. Finally, the second electrode 4 is formed on the luminescent part 3 to prepare the display element according to the present invention.

Substrate

In the present invention, the substrate is used as a lower surface of the first electrode and as such does not need to be transparent. Specific examples of substrates include substrates of quartz, glass, silicon wafers, and glass with TFT (thin-film transistor) formed thereon, or polymeric substrates of polycarbonate (PC), polyethylene terephthalate (PET), polybutylene terephthalate (PBT), polyphenylene sulfide (PPS), polyimide (PI), polyamide-imide (PAI), polyether sulfone (PES), polyether imide (PEI), polyetherether ketone (PEEK) and the like. Among them, quartz, glass, silicon wafers, or polymeric substrates of polyimide (PI), polyamide-imide (PAI), polyether sulfone (PES), polyether imide (PEI), polyetherether ketone (PEEK) and the like are particularly preferred. Since these substrates can withstand a temperature of 200° C. or above, high temperature treatment can be carried out in the production stage.

First Electrode (anode)

a) Metal Layer

The metal constituting the metal layer is not particularly limited so far as the metal is electrically conductive. Examples of metals usable herein include chromium (Cr), nickel (Ni), tungsten (W), manganese (Mn), indium (In), tin (Sn), zinc (Zn), aluminum (Al), gold (Au), silver (Ag), tantalum (Ta), platinum (Pt), palladium (Pd), molybdenum (Mo), vanadium (V), titanium (Ti), tantalum (Ta), niobium (Nb), and a combination of two or more of the above metals, an alloy composed mainly of the above metals, and a combination thereof. The metal is preferably selected from the group consisting of chromium, nickel, tungsten, manganese, indium, tin, and zinc.

In a preferred embodiment of the present invention, the metal layer comprises a laminate of one or more alloys and one or more metals or alloys. The alloy particularly preferably has excellent heat resistance and corrosion resistance, and examples of such alloys include Cr-base alloys (for example, Cr—Al—Mn—Si alloy and Cr—Mn—C—Si alloy) and Ni—Cr-base alloys (for example, Cr—Ni—C—Mn alloy, Cr—Ni—Mn—Si alloy, Cr—Ni—Mo—Mn alloy, Cr—Ni—Ti—Mn alloy, Cr—Ni—Ta—Mn alloy, and Cr—Ni—Cu—C alloy). Alloys comprising nickel, titanium, tantalum, and zirconium include Ti-base alloys (for example, Ti—Al—Sn alloy, Ti—Mn alloy, and Ti—Al—V alloy), and Zr—Ni—base alloys (Zr—Sn—Fe alloy, Zr—Sn—Fe—Cr alloy, Ni—Cr—Fe—Ti alloy, Ni—Cr—Mo—Fe alloy, Ni—Cu—Fe alloy, Ni—Cr—Fe alloy, and Ni—Mn—Al—Si alloy). Further, amorphous metal alloys may also be preferably used. Specific examples of amorphous metal alloys include metal-semi-metal (metal: e.g., iron (Fe), cobalt (Co), nickel (Ni), and niobium (Nb), semi-metal: e.g., phosphorus (P), boron (B), and silicon (Si)) amorphous alloys and metal-metal (e.g., Fe—Zr, lanthanum (La)—Cu, uranium (U)—Co, and Ca—Al) amorphous alloys.

Specific examples of the laminate construction of the metal layer include electrode/alloy in which a Cr-base or Ni—Cr-base alloy has been stacked on a lower electrode, or electrode/amorphous metal in which an amorphous metal has been stacked on a lower electrode metal, alloy/amorphous metal, amorphous metal/alloy, or a combination such as an alternately stacked structure of these laminates.

The formation of the above metal layer can reduce protrusions derived from metal grain boundaries and can reduce the average surface roughness. Therefore, a display element, in which the occurrence of shortcircuiting and leak current has been suppressed, can be realized. Preferably, the metal layer has a resistivity of not more than $1 \times 10^{-2}$ Ω·cm.

Methods usable for the formation of the metal layer on the substrate include sputtering, vacuum heat deposition, EB deposition, and ion plating.

The thickness of the metal layer formed on the substrate is not particularly limited. However, for example, in the case of a simple matrix drive panel, the thickness of the metal layer is in the range of 40 to 500 nm, preferably in the range of 100 to 300 nm. When the metal layer thickness is in the above-defined range, the resistance value can be brought to a preferred value, and, in addition, the metal layer can be made smooth. Further, breaking at a level difference or disconnection of the transparent electrode layer or the like can be effectively prevented.

b) Corrosion-resistant Charge Injection Accelerating Layer

The corrosion-resistant charge injection accelerating layer can function as a charge injection layer and further can function to suppress the corrosion of the metal layer in the first electrode. Therefore, independently of the type of the metal constituting the metal layer, the corrosion-resistant charge injection accelerating layer can accelerate the injection of charges into the luminescent layer, can improve the durability of the first electrode, can suppress the occurrence of dark spots, and can realize a display element having high luminescence efficiency.

The corrosion-resistant charge injection accelerating layer is formed by subjecting a surface of the metal layer formed on the surface of the substrate to plasma treatment (oxidation treatment) using an oxygen atom-containing gas. The expression "oxygen atom-containing gas" as used herein refers to gases composed of oxygen molecules (for example, $O_2$ and $O_3$) and gases containing an oxygen atom(s) as a constituent element (for example, $H_2O$, CO, and $CO_2$). In the present invention, the plasma treatment can be carried out, for example, in such a manner that a mixed gas composed of argon (Ar) and oxygen ($O_2$) is brought to a plasma gas at a partial pressure of $Ar:O_2=1:1$ to 100:1, the gas pressure within a film formation atmosphere is brought to about 0.5 to 0.01 Pa, and the RF output is set to 50 to 1000 W.

In the plasma treatment using an oxygen atom-containing gas, the surface of the metal layer can be oxidized in vacuo to form a corrosion-resistant charge injection accelerating layer. Further, it is estimated that, since $Ar^+$ collides with the surface of the metal layer, impurities present on the surface can be removed to effectively prevent the deposition of fine particles of the impurities on the surface of the metal layer. By virtue of this, according to the present invention, unlike the prior art technique, a luminescent part can be formed on the first electrode without cleaning the first electrode after the formation thereof.

The thickness of the corrosion-resistant charge injection accelerating layer can be properly determined. Specifically, the plasma treatment can be regulated to regulate the thickness of the corrosion-resistant charge injection accelerating layer. The plasma treatment can be suitably regulated by regulating the treatment time, the partial pressure of $Ar:O_2$, and RF output. The regulation of the thickness of the corrosion-resistant charge injection accelerating layer can improve the charge transport capacity (work function) and corrosion resistance of the first electrode.

In the present invention, the metal (alloy) in the metal layer for the formation of the corrosion-resistant charge injection accelerating layer may be in an oxidized state.

Rather the oxidized state is preferred. The metal constituting the metal layer may be oxidized, for example, by natural oxidation, plasma treatment, or ozone UV treatment.

The thickness of the corrosion-resistant charge injection accelerating layer is not less than 0.1 nm and not more than 500 nm. Preferably, the upper limit of the thickness is 1 nm, and the lower limit of the thickness is 300 nm.

c) Characteristics

The reflectance, from the first electrode, of light incident through the second electrode side is not more than 70%, preferably not more than 60%, in the visible region (in the range of 380 to 780 nm). When the light reflectance is in the above-defined range, light reflected from the first electrode upon incidence of external light to the first electrode can be effectively suppressed. At the same time, the function of the display device as a specular surface can be prevented without use of any circularly polarizing film. Therefore, a high-contract display element can be realized at a reduced production cost.

In the present invention, preferably, the resistivity of the corrosion-resistant charge injection accelerating layer is lower than the resistivity of the luminescent layer. This is because, when the resistivity of the metal layer is low, large current density and brightness can be realized at low voltage. Consequently, a display element with high luminescent efficiency can be achieved by accelerating the charge injection (increasing the current density). Here the resistivity (specific resistance) "$\rho$ ($\Omega \cdot cm$)" means the inverse number of electrical conductivity "$\sigma$," that is, $\rho = 1/\sigma$. The resistance R of a part of length L in a homogeneous lead having an even cross-sectional area S is $R = (L/S)\rho$. The electrical conductivity refers to a constant $\sigma$ in a relationship between the current density i and the electric field E in the conductor, that is, $i = \sigma E$.

Organic Layer

The organic layer in the present invention comprises a luminescent layer as an indispensable component. The organic layer may have a multilayer structure of the luminescent layer and optional layer(s) which will be described later.

1) Luminescent Layer

Materials usable for constituting the luminescent layer include inorganic luminescent materials and organic luminescent materials. For example, dye luminescent materials, metal complex luminescent materials and polymeric luminescent materials.

Specific examples of dye materials include cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumarylamine derivatives, oxadiazole dimmers, and pyrazoline dimmers.

Specific examples of metal complex materials include quinolinol aluminum complex, benzoquinolinol beryllium complex, benzoxazole zinc complex, benzothiazole zinc complex, azomethyl zinc complex, porphyrin zinc complex, europium complex, iridium metal complex, platinum metal complex, and metal complexes in which the center metal is aluminum, zinc, beryllium or the like, or a rare earth metal such as terbium (Tb), eruopium (Eu), or dysprosium (Dy) while the ligand is oxadiazole, thiadiazole, phenylpyridine, phenylbenzoimidazole, quinoline or other structures.

In the present invention, a quinolinol aluminum metal complex (Alq3) represented by chemical formula (I) can be utilized:

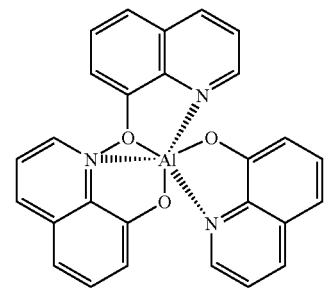

Specific examples of polymeric materials include poly-p-phenylenevinylene derivatives, polythiophene derivatives, poly-p-phenylene derivatives, polysilane derivatives, polyacetylene derivatives, polyfluorene derivatives, polyvinylcarbazole derivatives, and polymers prepared by polymerizing the above dyes and metal complex luminescent materials.

In the present invention, poly(dioctyldivinylenefluorene-co-anthracene) represented by chemical formula (II) can be utilized:

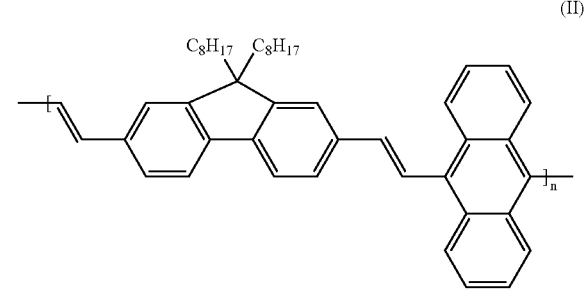

wherein n is not less than 5,000 and not more than 1,000,000, preferably not less than 10,000 and not more than 800,000.

The luminescent layer is formed in a pattern form, and, in the case of a full-color display element, luminescent layers of a plurality of colors are each patterned.

The thickness of the luminescent layer is not less than 1 nm and not more than 300 nm, preferably not less than 5 nm and not more than 100 nm.

2) Optional Layer

In the present invention, the organic layer may have a multilayer structure of the luminescent layer and additional layers such as a hole injection layer, a hole transport layer, a hole transport injection layer, an electron transport layer, and an electron injection layer stacked on top of one another.

a) Hole Injection Layer

In a preferred embodiment of the present invention, the hole injection layer is formed particularly on the first electrode side. The hole injection layer may be formed of any material without particular limitation so far as the material can stabilize the injection of the hole from the anode into the organic luminescent layer. Specific examples of materials usable herein include electrically conductive polymers such as doped polyaniline, polyphenylenevinylene, polythiophene, polypyrrole, poly-p-phenylene, and polyacetylene, or organic materials which constitute charge transfer complexes comprising electron-donating compounds such as organic materials including a phenylenediamine site and electron-accepting compounds such as tetracyanoquinodimethane and tetracyanoethylene.

The thickness of the hole transport layer is not less than 1 nm and not more than 300 nm, preferably not less than 100 nm and not more than 200 nm.

b) Hole Transport Layer

In an embodiment of the present invention, the hole transport layer is formed particularly on the first electrode side. The hole transport layer may be formed of any material without particular limitation so far as the material can stabilize the transport of the hole from the anode into the organic luminescent layer. Specific examples of materials usable herein include N-(1-naphthyl)-N-phenylbenzidine (α-NPD) and triphenyldiamine (TPD). The hole transport layer preferably blocks electrons which has been injected from the cathode.

The thickness of the hole transport layer is not less than 1 nm and not more than 300 nm, preferably not less than 5 nm and not more than 100 nm.

c) Hole Injection Transport Layer

In another embodiment of the present invention, a hole injection transport layer, which functions both as the hole transport layer and the hole injection layer, may be provided between the corrosion-resistant charge injection accelerating layer and the luminescent layer.

The hole injection transport layer may be formed of any material without particular limitation so far as the material exhibits the contemplated function. Specifically, any material, which can stably transport the hole supplied from the anode into the luminescent layer without particular limitation. Specific examples thereof include N-(1-naphthyl)-N-phenylbenzidine (α-NPD), 4,4,4-tris(3-methylphenylphenylamino)triphenylamine (MTDATA), and high-molecular weight materials such as poly-3,4-ethylenedioxythiophene (PEDOT), polyaniline derivatives, and polyphenylenvinylene derivatives.

In the present invention, polyethylenedioxythiophene (PEDOT/PSS), which is a mixture of polyethylenedioxythiophene (PEDOT; left compound) and polystyrenesulfonic acid (PSS; right compound) represented by chemical formula (III) can be utilized:

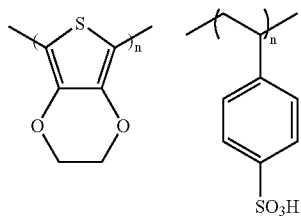

(III)

wherein n in the left compound is not less than 5,000 and not more than 1,000,000, preferably not less than 10,000 and not more than 800,000; and n in the right compound is not less than 1,000 and not more than 1,000,000, preferably not less than 3,000 and not more than 500,000. The mixing ratio between PEDOT and PSS can be freely determined.

Further, bis(N-naphthyl)-N-phenylbenzidine (α-NPD) represented by chemical formula (IV) can be utilized:

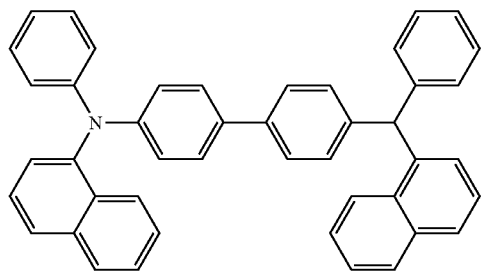

(IV)

The thickness of the hole injection transport layer is not particularly limited so far as the contemplated function can be satisfactorily exhibited. In general, however, a thickness in the range of 10 to 300 nm, particularly in the range of 30 to 200 nm, is preferred.

d) Electron Transport Layer

The electron transport layer can function to transport an electron supplied from the second electrode into the luminescent layer and is formed between the second electrode and the organic layer or between the protective layer and the organic layer. The electron transport layer may be formed of any material without particular limitation so far as the material exhibits the contemplated function. Specific examples of materials usable herein include organic materials such as quinolinol aluminum complex (Alq3), bathocuprone (BCP), and bathophenanthroline (Bphen). Among them, bathocuprone (BCP) and bathophenanthroline (Bphen) are preferred.

The thickness of the electron transport layer is not less than 1 nm and not more than 100 nm, preferably not less than 5 nm and not more than 50 nm.

e) Electron Injection Layer

The electron injection layer functions to transport an electron supplied from the second electrode into the luminescent layer and is provided between the second electrode and the organic layer, between the protective layer and the organic layer, or between the electron transport layer and the protective layer. When a protective layer having a large work function is provided, the electron injection layer can realize direct injection of an electron from the protective layer into the luminescent layer.

The electron injection layer may be formed of any material so far as the material can exhibit the contemplated function. Specific examples of materials usable herein include electrically conductive polymers such as doped polyaniline, polyphenylenevinylene, polythiophene, polypyrrole, poly-p-phenylene, and polyacetylene, and organic materials which constitute charge transfer complexes comprising electron-donating compounds and electron-accepting compounds. In a preferred embodiment of the present invention, the material is an oxide or fluoride of an alkali metal or an alkaline earth metal, for example, LiF, NaF, $LiO_2$, $MgF_2$, $CaF_2$, $SrF_2$, or $BaF_2$. These materials can facilitate electron injection at a low voltage and can impart durability such as water resistance and heat resistance to the display element. The thickness of the electron injection layer is preferably in the range of 0.2 to 10 nm.

In a preferred embodiment of the present invention, the electron injection layer may be formed of a metal material per se having a work function of not more than 4.0 eV, specifically barium (Ba), calcium (Ca), lithium (Li), cesium (Cs), magnesium (Mg), strontium (Sr) or the like. The thickness of the electron injection layer is preferably in the range of 0.2 to 50 nm, particularly in the range of 0.2 to 20 nm. When the thickness of the electron injection layer is in the above-defined range, light can be taken out from the transparent electrode.

In a preferred embodiment of the present invention, the electron injection layer is provided as an electron transport injection layer which functions both as the electron transport layer and the electron injection layer. In this case, the electron transport injection layer may be formed of a mixture of an electron transport layer-constituting material with an electron injection layer-constituting material. The electron transport injection layer may be, for example, a layer formed by co-vapor deposition of the above-described electron transport layer-constituting organic material, that is, Alq3 (quinolinol aluminum complex), BCP (bathocuprone), and Bphen (bathophenanthroline) and the above-described electron injection layer-constituting material, that is, alkali metals or alkaline earth metals such as barium, calcium, lithium, cesium, magnesium, and strontium. In the electron transport injection layer formed by the co-vapor deposition, the organic material:metal molar ratio is about 1:1 to 1:3, preferably about 1:1 to 1:2. The thickness of the electron transport injection layer formed by the co-vapor deposition is 5 to 200 nm, preferably 10 to 80 nm. Since the electron transport injection layer formed by the co-vapor deposition has high electron mobility and higher light transparency than the elementary metal, the above thickness can be realized.

Method for Organic Layer Formation

Methods usable for the formation of (each) layer constituting the organic layer include a method wherein each layer is formed in a pattern form from the material for constituting the layer, for example, by vapor deposition, printing, or ink jet recording, and a method wherein each layer is formed by coating a coating liquid containing the material for constituting the layer, for example, by a coating method such as spin coating, casting, dipping, bar coating, blade coating, roll coating, gravure coating, flexo printing, spray coating, or self-organization (alternate adsorption or self-organization monolayer film). In general, vapor deposition is utilized for low-molecular weight materials, and other methods, particularly coating methods, are utilized for high-molecular weight materials.

Second Electrode (Cathode)

The second electrode comprises a (transparent) electrode layer and optionally a protective layer.

a) (Transparent) Electrode Layer

The (transparent) electrode layer may be formed of any material without particular limitation so far as the material is electrically conductive. The electrode layer, however, is preferably formed of a transparent material. Examples of such materials include electrically conductive inorganic materials. Specific examples of such materials include In—Zn—O (IZO), In—Sn—O (ITO), ZnO—Al, Zn—Sn—O, In—O, Sn—O, Zn—O, Cd—O, Cd—In—O, Cd—Sn—O, Mg—In—O, and Ca—Ga—O materials, or $TiO_2$, TiN, ZrN, HfN, $LaB_6$ and the like. Preferably, indium-containing inorganic oxides (more preferably ITO or IZO) and TiN may be mentioned. ITO and IZO have high electrical conductivity and light transmittance and low resistivity. Therefore, the light take-out efficiency can be improved, and, at the same time, the drive voltage of the EL element can be lowered. TiN has high electrical conductivity and light transmittance and low resistivity. Therefore, the light take-out efficiency can be improved, and, at the same time, in the step of film formation by sputtering, there is no need to introduce oxygen, and, thus, the oxidation of the organic layer and the electron injection layer can be effectively prevented.

The light transmittance of the transparent electrode layer is not less than 50%, preferably not less than 80%, in the visible region of 380 to 780 nm. When the light transmittance is in the above-defined range, light can be efficiently taken out from the transparent electrode layer side.

The thickness of the transparent electrode layer is preferably in the range of 10 to 500 nm, particularly in the range of 50 to 300 nm. When the transparent electrode layer thickness is in the above-defined range, the function and light transmittance as the second electrode are satisfactory and durability can be imparted to the second electrode.

b) Protective Layer

In a preferred embodiment of the present invention, the second electrode comprises a (transparent) electrode layer and a protective layer. This protective layer mainly functions to protect an organic layer (especially a luminescent layer, an electron transport layer, or an electron injection layer) and optionally functions as an electron transport layer which transports an electron from the transparent electrode layer.

In forming the transparent electrode layer by sputtering or the like, the protective layer functions to protect the organic layer, especially the luminescent layer or the electron injection layer, from high-energy ion bombardment.

The protective layer may be formed of any material without particular limitation so far as the material has the above function. Preferably, however, the protective layer is formed of a transparent material. Specific examples of preferred materials include those having a resistivity of not more than $1 \times 10^{-2} \Omega \cdot cm$, for example, aluminum (Al), silver (Ag), gold (Au), chromium (Cr), or an alloy of magnesium (Mg) with silver, an alloy of magnesium with aluminum, or an chromium- or nickel-containing alloy.

Methods usable for the protective layer formation include vacuum deposition, sputtering, and electron beam methods. The thickness of the protective layer is in the range of 5 to 30 nm, preferably in the range of 8 to 25 nm. When the protective layer thickness is in the above-defined range, light transparency can be imparted to the protective layer.

Light-transparent materials may also be utilized. Specific examples of such materials include TiN, ZrN, HfN, and $LaB_6$. When the protective layer is formed using the above material, there is no need to introduce oxygen. Therefore, the oxidation of the electron injection layer formed of an alkali metal or an alkaline earth metal can be prevented. In this case, the thickness of the protective layer may be in the range of 10 to 500 nm, preferably in the range of 50 to 200 nm. When the protective layer thickness is in the above-defined range, the luminescence efficiency and the drive voltage function are satisfactory.

Production Process of Display Element According to Invention

The production process of the display element according to the present invention will be briefly described.

A metal layer is formed on a substrate. The formed metal layer is then patterned. The surface of the patterned metal layer is oxidized by plasma treatment using an oxygen atom-containing gas to form a corrosion-resistant charge injection accelerating layer on the surface of the metal layer. Next, an organic layer is stacked on the corrosion-resistant charge injection accelerating layer preferably under a degree of vacuum of not more than $1 \times 10^{-2}$ Pa. When the organic layer is formed in a predetermined degree of vacuum, the inclusion of gas molecules such as water molecules or oxygen molecules in the organic layer is prevented, and a durable display element can be provided.

In a more preferred embodiment of the present invention, an inorganic acid- or organic acid-doped electrically conductive polymer coating solvent or a water-soluble coating solvent composed mainly of the above electrically conductive polymer is coated onto the corrosion-resistant charge injection accelerating layer to stack the organic layer. As compared with the vacuum film formation method, the formation of the organic layer by the coating method can shorten the film formation step time and can improve the material utilization efficiency.

Specific examples of dopants as the acceptor include Lewis acids such as $BF_3$, $PF_5$, $AsF_5$, $SbF_5$, and $SO_3$, protonic acids such as $HNO_3$, $H_2SO_4$, $HClO_4$, HF, HCl, $FSO_3H$, and $CF_3SO_3H$, halogens such as $Br_2$, $I_2$, and $Cl_2$, transition metal halides such as $FeCl_3$, $MoCl_5$, $SnCl_4$, $MoF_5$, and $SnI_4$, and organic acids such as benzenesulfonic acid, toluenesulfonic acid, camphorsulfonic acid, polystyrenesulfonic acid, polyvinylsulfonic acid, polyhydroxyethersulfonic acid, and polybutadienesulfonic acid.

Specific examples of dopants as the donor include alkali metals such as lithium (Li), sodium (Na), potassium (K), and calcium (Ca) and electrically conductive polymers such as polyaniline, polyphenylenevinylene, polythiophene, polypyrrole, poly-p-phenylene, and polyacetylene.

After the formation of the organic layer, the protective layer is formed by sputtering or the like, and the second electrode is then formed to prepare a display element.

Use

The display element according to the present invention can be utilized as an electroluminescent display element, especially an electroluminescent element.

Measurement Means

The "reflectance" and "transmittance" referred to in the present specification are values measured with a UV spectrophotometer (UV-2200A, manufactured by Shimadzu Seisakusho Ltd.) at room temperature in the air.

EXAMPLES

The following examples further illustrate the present invention but are not intended to limit it.

Example 1

A substrate (a transparent glass having a size of 25 mm in length×25 mm in width×0.7 mm in thickness; alkali-free glass NA 35, manufactured by NH TECHNO GLASS CORP.) is cleaned, and a 200 nm-thick metal layer of chromium was then formed on the substrate by magnetron sputtering (sputtering gas: argon (Ar), pressure: 0.3 Pa, DC output: 200 W).

Thereafter, patterning was carried out by photolithography (resist: OFPR-800, manufactured by Tokyo Ohka Kogyo Co., Ltd.; etching liquid: Cr-01N, manufactured by Kanto Chemical Co., Inc.) to form a pattern of 2 mm-wide line×2.

The substrate and the metal layer were ultrasonically cleaned, and the metal layer on its surface (second electrode side) was then subjected to plasma treatment. At the outset, argon was provided as a sputtering gas, and the pressure and the RF output were brought to 1.0 Pa and 100 W, respectively. The oxide layer located on the naturally oxidized surface of the metal layer was removed. Further, plasma treatment was then carried out using argon and oxygen as the sputtering gas under conditions of gas partial pressure $Ar:O_2=1:1$, pressure 1.0 Pa, and RF output 100 W for one min to oxidize the surface of the metal layer, whereby a corrosion-resistant charge injection accelerating layer was formed on the surface of the metal layer.

Polyethylenedioxythiophene (PEDOT (PSS)) represented by chemical formula (I) was spin coated on the patterned first electrode to form an 80 nm-thick layer which was then heat dried in vacuo to form a hole injection transport layer.

An 80 nm-thick layer of poly(dioctyldivinylene-fluorene-co-anthracene) represented by chemical formula (II) was formed as a luminescent layer in a glove box under low-oxygen conditions, that is, in an oxygen concentration of 0.8 ppm, and under low-humidity conditions, that is, in a humidity of not more than 1 ppm (dew point: −117° C.), and the formed luminescent layer was heat dried in vacuo. Thereafter, calcium was heat deposited in vacuo to form a 3 nm-thick electron injection layer under conditions of degree of vacuum $8\times10^{-5}$ Pa and film formation rate 0.2 angstrom/sec.

A 20 nm-thick protective layer was formed by vacuum deposition of gold under conditions of degree of vacuum $8\times10^{-5}$ Pa and film formation rate 0.1 angstrom/sec.

Thereafter, an IZO electrode was formed as a transparent electrode layer by sputtering. The transparent electrode layer was formed by means of an opposed target-type magnetron sputtering apparatus under film forming conditions of a mixed gas, as a sputtering gas, composed of argon and oxygen (volume ratio $Ar:O_2=400:1$), RF output 100 W, DC output 80 W, and film formation rate 2 angstroms/sec and $5.5\times10^{-2}$ Pa. The thickness of the transparent electrode layer was 150 nm.

Thus, a display element (an organic EL element) having a luminescent area of 2 mm×2 mm was prepared by forming the first electrode and the second electrode which crossed each other. Upon the application of 8 V to this element, the current density was about 210 mA/cm$^2$, and the brightness was about 950 cd/m$^2$.

Example 2

An organic EL element was prepared in the same manner as in Example 1, except that a 20 nm-thick protective layer of aluminum was formed by vacuum deposition under conditions of degree of vacuum $1\times10^{-4}$ Pa and film formation rate 0.5 angstrom/sec. In this element, luminescence was observed from the second electrode side. Upon the application of 8 V to this element, the current density was about 210 mA/cm$^2$, and the brightness was about 900 cd/m$^2$.

Example 3

A metal layer formed on a substrate was ultrasonically cleaned, and the metal layer was subjected to plasma treatment. At the outset, plasma treatment was carried out using argon as the sputtering gas under conditions of pressure 1.0 Pa and RF output 100 W. The oxide layer in the naturally oxidized surface of the metal layer was removed, and plasma treatment was then further carried out using argon and oxygen as the sputtering gas under conditions of gas partial pressure $Ar:O_2=1:1$, pressure 1.0 Pa, and RF output 100 W to oxidize the surface of the metal layer, whereby a corrosion-resistant charge injection accelerating layer was formed on the surface of the metal layer. The treatment time of oxygen plasma treatment was changed to 20 sec to 10 min to measure the work function of the first electrode. The work function value was measured in the air with a surface analyzer AC-1 manufactured by RIKEN KEIKI CO., LTD. The results are shown in Table 1.

TABLE 1

| | Sputtering gas composition | Plasma treatment time | Work function, eV |
|---|---|---|---|
| Example 3-1 | Ar/O$_2$ | 20 sec | 5.65 |
| Example 3-2 | Ar/O$_2$ | 1 min | 5.84 |
| Example 3-3 | Ar/O$_2$ | 2 min | 5.86 |
| Example 3-4 | Ar/O$_2$ | 3 min | 5.86 |
| Example 3-5 | Ar/O$_2$ | 5 min | 5.83 |
| Example 3-6 | Ar/O$_2$ | 10 min | 5.78 |

Examples 4 to 9

Organic EL elements of Examples 4 to 9 were prepared in the same manner as in Example 1, except that the treatment time of oxygen plasma treatment was changed to 20 sec to 10 min, the electron injection layer was not formed, and aluminum was vapor deposited to 150 nm on the 20 nm-thick gold protective layer.

Example 10

In the same manner as in Example 1, oxygen plasma treatment was carried out to oxidize the surface of the metal layer and thus to form a corrosion-resistant charge injection accelerating layer.

Next, a 50 nm-thick hole injection transport layer was formed on the patterned first electrode by heat deposition in vacuo of (N-naphthyl)-N-phenylbenzidine represented by chemical formula (III) under conditions of degree of vacuum $5 \times 10^{-5}$ Pa and film formation rate 2 angstroms/sec.

Thereafter, a 50 nm-thick luminescent layer was formed by heat deposition in vacuo of aluminum-quinolinol metal complex (Alq3) represented by chemical formula (I) under conditions of degree of vacuum $5 \times 10^{-5}$ Pa and film formation rate 2 angstroms/sec.

A 0.5 nm-thick electron injection layer was formed on the luminescent layer by heat deposition in vacuo of lithium fluoride (LiF) under conditions of degree of vacuum $5 \times 10^{-5}$ Pa and film formation rate 0.1 angstrom/sec.

Next, a 20 nm-thick protective layer was formed by vacuum deposition of aluminum under conditions of degree of vacuum $1 \times 10^{-4}$ Pa and film formation rate 0.5 angstrom/sec. Thereafter, IZO was formed as a transparent electrode layer in the second electrode by sputtering. The transparent electrode layer was formed by means of an opposed target-type magnetron sputtering apparatus under film forming conditions of a mixed gas, as a sputtering gas, composed of argon and oxygen (volume ratio Ar:O$_2$=400:1), RF output 100 W, DC output 80 W, and film formation rate 2 angstroms/sec and $5.5 \times 10^{-2}$ Pa. The thickness of the transparent electrode layer was 150 nm.

Thus, an organic EL element having a luminescent area of 2 mm×2 mm was prepared by forming the first electrode and the second electrode which crossed each other.

Luminescence from the organic EL element was observed from the second electrode side. Upon the application of 6 V to this element, the current density was 13 mA/cm$^2$, and the brightness was about 350 cd/m$^2$.

Comparative Example 1

An organic EL element was prepared in the same manner as in Example 4, except that the oxygen plasma treatment time was changed to 5 min and the first electrode was changed to ITO.

Comparative Example 2

An organic EL element was prepared in the same manner as in Example 4, except that the plasma treatment was carried out for 3 min without introducing oxygen.

Comparative Example 3

An organic EL element was prepared in the same manner as in Example 10, except that the plasma treatment was carried out for 3 min without introducing oxygen.

For this organic EL element, upon the application of 6 V, the current density was 11 mA/cm$^2$, and the brightness was about 310 cd/m$^2$.

Evaluation Test

A voltage of 8 V or 6 V was applied to the display elements of Examples 1 to 11 and Comparative Examples 1 and 2. At that time, the current density was measured. The results were as shown in Table 2 below.

TABLE 2

| | Sputtering gas composition | Plasma treatment time | Current density, mA/cm$^2$ (Applied voltage) | |
|---|---|---|---|---|
| | | | 8 V | 6 V |
| Example 1 | Ar/O$_2$ | 1 min | 210 | |
| Example 2 | Ar/O$_2$ | 1 min | 210 | |
| Example 4 | Ar/O$_2$ | 20 sec | | 4.1 |
| Example 5 | Ar/O$_2$ | 1 min | | 9.8 |
| Example 6 | Ar/O$_2$ | 2 min | | 3.8 |
| Example 7 | Ar/O$_2$ | 3 min | | 1.3 |
| Example 8 | Ar/O$_2$ | 5 min | | 1.1 |
| Example 9 | Ar/O$_2$ | 10 min | | 0.7 |
| Example 10 | Ar/O$_2$ | 1 min | | 13 |
| Comparative Example 1 | Ar/O$_2$ | 5 min | | 2.6 |
| Comparative Example 2 | Ar | 3 min | | 0.9 |
| Comparative Example 3 | Ar | 3 min | | 11 |

The invention claimed is:

1. A display element comprising a first electrode, a luminescent layer, a second electrode, and a transparent substrate, wherein said first electrode comprising a metal layer and a corrosion-resistant charge injection accelerating layer and reflects not more than 70% of light in the visible region incident through the second electrode side;

said metal layer comprising a laminate of one or more alloys and one or more metals, said metals being selected from the group consisting of chromium (Cr), nickel (Ni), tungsten (W), manganese (Mn), indium (In), tin (Sn), zinc (Zn), molybdenum (Mo), vanadium (V), titanium (Ti), tantalum (Ta), niobium (Nb), and a mixture thereof, said corrosion-resistant charge injection accelerating layer having been formed by subjecting a surface layer in said metal layer to plasma treatment using an oxygen atom-containing gas and having a lower resistivity than the luminescent layer.

2. The display element according to any one of claim 1, which is used as an electroluminescent element.

* * * * *